(12) United States Patent
Gutierrez-Aitken et al.

(10) Patent No.: US 6,680,494 B2
(45) Date of Patent: Jan. 20, 2004

(54) ULTRA HIGH SPEED HETEROJUNCTION BIPOLAR TRANSISTOR HAVING A CANTILEVERED BASE

(75) Inventors: Augusto L. Gutierrez-Aitken, Redondo Beach, CA (US); Aaron K. Oki, Torrance, CA (US); Eric N. Kaneshiro, Torrance, CA (US); Dwight C. Streit, Seal Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 28 days.

(21) Appl. No.: 09/776,513

(22) Filed: Feb. 2, 2001

(65) Prior Publication Data

US 2001/0023947 A1 Sep. 27, 2001

Related U.S. Application Data

(63) Continuation-in-part of application No. 09/526,760, filed on Mar. 16, 2000, now abandoned.

(51) Int. Cl.[7] ............................................. H01L 29/732
(52) U.S. Cl. ..................... 257/183; 257/18; 257/197; 257/198; 257/627; 257/628
(58) Field of Search ......................... 257/183, 197–198, 257/627, 628

(56) References Cited

U.S. PATENT DOCUMENTS

| 3,878,550 A | * | 4/1975 | Benajmin ..................... 357/36 |
| 4,000,019 A | * | 12/1976 | Van den Brekel ........... 148/175 |
| 4,775,882 A | * | 10/1988 | Miller et al. .................. 357/35 |
| 4,872,046 A | * | 10/1989 | Morkoc et al. ............... 357/60 |
| 4,951,108 A | * | 8/1990 | Leduc ........................... 357/36 |
| 5,625,206 A | * | 4/1997 | Chandrasekhar et al. ... 257/198 |
| 5,672,522 A | * | 9/1997 | Streit et al. ................... 437/31 |
| 5,717,228 A | * | 2/1998 | Matsuoka et al. ........... 257/197 |
| 5,783,845 A | * | 7/1998 | Kondo et al. ................ 257/198 |
| 6,245,615 B1 | * | 6/2001 | Noble et al. ................. 438/270 |
| 6,392,258 B1 | * | 5/2002 | Hirata et al. ................. 257/197 |
| 6,406,965 B1 | * | 6/2002 | Lammert ...................... 438/312 |
| 6,566,693 B1 | * | 5/2003 | Thomas, III et al. ........ 257/197 |

FOREIGN PATENT DOCUMENTS

| EP | 478 923 | * | 4/1992 |
| EP | 710 984 | * | 5/1996 |
| JP | 3-108339 | * | 5/1991 |
| JP | 5-48078 | * | 2/1993 |
| JP | 7-201284 | * | 8/1995 |
| JP | 10-242161 | * | 9/1998 |

OTHER PUBLICATIONS

Miyamoto, et al., "Reduction of Base–Collector Capacitance by Undercutting the Collector and Subcollector in GaInAs/Inp DHBT'S", The Electron Devices Letters, vol. 17, No. 3, Mar. 1996, pp. 97–99.

* cited by examiner

Primary Examiner—Nathan J. Flynn
Assistant Examiner—Ahmed J. Sefer
(74) Attorney, Agent, or Firm—Ronald M. Goldman; Connie Thousand

(57) ABSTRACT

Reduction in the base to collector capacitance of a heterojunction bipolar transistor, and, improved high frequency performance is achieved using existing materials and processes by undercutting the collector (5) under the base (7) along two parallel sides of the base mesa (7—FIG. 4), and providing a sloped collector edge (5—FIG. 6) along the remaining two parallel sides of the base. The foregoing is accomplished by selective etching and with the four sides of the mesa regions oriented as a non-rectangular parallelogram (7, 9—FIG. 4) in which one pair of sides is in parallel with one of the said [0 0 1] and [0 0 $\bar{1}$] planes of the crystalline structure and the other pair of sides in parallel with one of the [0 1 1] and [0 $\bar{1}$ $\bar{1}$] planes of the crystalline structure.

4 Claims, 3 Drawing Sheets

Section A-A' with Interconnect Metal

Cross Section A-A

Cross Section B-B

Cross Section C-C

ULTRA HIGH SPEED HETEROJUNCTION BIPOLAR TRANSISTOR HAVING A CANTILEVERED BASE

This is a continuation in part of application Ser. No. 09/526,760 filed Mar. 16, 2000, now abandoned.

FIELD OF THE INVENTION

This invention relates to improvements in heterojunction bipolar transistors ("HBT") and, more particularly, to a practical HBT construction that obtains both an improved figure of merit in HBT performance and an improved maximum frequency of oscillation for the HBT.

BACKGROUND

Heterojunction bipolar transistors ("HBT"), which find application, as example, in high speed (eg. high frequency) digital switching, are known and well defined in the technical literature. The HBT is a layered structure, such as illustrated in side view (width) in FIG. 1. That layered structure includes a semiconductor substrate 1, a subcollector 3, collector 5, base 7 and emitter 9 stacked one atop the other in an integral assembly. Metal contacts are formed on the emitter, base and subcollector for appropriate connection to external power supply and/or other electronic circuits. Those metal contacts include a subcollector metal 11, a base metal 13, and emitter metal 15.

In top view the familiar HBT appears as in FIG. 2, wherein the subcollector 3 defines a large rectangle in shape. Within that rectangular region and, as viewed from the top, the rectangular shaped emitter metal 15 is formed atop and almost covers the rectangular region of the emitter layer 9, also rectangular in shape. The base metal 13 is formed upon the base layer 7 and essentially forms a picture-frame like structure surrounding emitter layer 9. The outer dimensions of base metal 13 fall short of the rectangular area defined by the base layer 7, the length, l, and width, w, of which, is referred to as the base mesa length and base mesa width. Collector 5 directly underlies base 7 and is not visible in this view. The collector metal 11 that is formed on subcollector layer 3 is an elongate rectangle in shape. It is noted that substrate 1 is omitted in this view.

A common HBT is the Indium Aluminum Arsenide, Indium Gallium Arsenide & Indium Phosphide ("InAlAs/InGaAs/InP") HBT, and the invention is more easily understood with that type of HBT as the example. Such HBT transistors are grown on an epi-layer of InP material, a crystalline wafer that is sliced from a large crystal (the boule) that is grown from a "seed." Typically the wafer is supplied by a specialty manufacturer, the crystal grower, to the transistor manufacturer and that wafer contains straight edges along two sides of the wafer. Those two straight edges are perpendicular to one another. Each straight edge is aligned with (formed parallel to) a respective plane of the crystal of the wafer as an aid to mask alignment for the photo-lithographic procedures used during manufacture of the HBT. Using conventional crystal growing techniques (such as molecular beam epitaxy, MBE) the additional layers necessary to form the transistor are grown on the face of the crystalline InP wafer, effectively further growing the crystal structure of the wafer in height.

The first additional layer, subcollector 3, is formed of a layer of InGaAs over a layer of InP material that has been doped negative, that is, the InGaAs and InP contains an impurity, typically Silicon, which gives the semiconductor layer a low electrical resistivity. The low resistivity enables the layer to serve as an electrical conductor to provide an electrical path from the collector metal 11 to the underside of collector 5. The next layer, the collector of the HBT, is grown using InP material, which is doped negative, but at a lower concentration than the doping of the subcollector. The collector is followed by growing a layer of InGaAs, the base 7 of the HBT, which is doped heavily positive using an impurity, customarily of Beryllium. The final semiconductor layer, the emitter 9, is grown of InAlAs (Indium Aluminum Arsenide) that is medium doped negative with Silicon.

Once the laminate-like crystal structure is completed, the masking and etching procedures follow to define the shape and size of the various layers, such as was illustrated in FIG. 2. The InAlAs/InGaAs/InP wafer structure is first masked and then etched with a phosphoric acid based solution that etches the top InAlAs layer. Then the structure is masked again and the InGaAs base layer is etched. Then the structure is masked and then etched with a hydrochloric ("HCl") acid based solution that etches the InP. For greater detail of the known processes, the reader is referred to the technical literature.

The available space ("real estate") on the wafer is sufficient to accommodate perhaps thousands of HBT's. Thus the mask contains the individual masks of identical layer geometry arranged in rows and columns to permit simultaneous fabrication of large numbers of HBT's and circuits containing HBTs. Those HBT's may later be cleaved ("diced") from the wafer and separated for individual packaging or retained on the substrate for use in a semiconductor array. For an understanding of the present invention only an individual HBT structure needs to be considered.

Once etching is completed, metal contacts are deposited in place on the subcollector, base and emitter layers. Typically a layer of a dielectric or polyimide, a plastic insulator, is used to cover the semiconductor, except for the regions on which the metal contacts are to be deposited. After deposition of the contact metal the conductive leads to the metal are deposited on and extend over that dielectric or polyimide insulator layer.

In the InAlAs/InGaAs/InP HBT of FIG. 1, as example, substrate 1 is about 500–600 microns in thickness, the subcollector 3 about 4,000 Angstroms ($1/10,000^{th}$ micron) thick, the collector 5 about 4,000 Angstroms thick, base 7 about 400 Angstroms and emitter 9 about 2,500 Angstroms in thickness. The metal contacts are about 2000 Angstroms in thickness. The foregoing dimensions illustrate the relative thickness (or scale) of the various regions of the HBT.

The function of the elements of the HBT and its theory of operation are well documented in the technical literature, and is not here repeated. Basically with the base, emitter and collector properly electrically biased, the HBT serves as an electronic switch or amplifier. As example, that electronic switch conducts current or not between emitter and collector in dependence on the application of a voltage of appropriate level to the base.

Being used in high speed digital application, the higher the operating frequency at which the device operates and the higher the figure of merit of a given HBT design, the better. The design consideration for each of those two factors are different and contradictory. It is found that enhancing the one factor is disparaging of the other factor and vice-versa.

As study has shown, the most important figures of merit of high frequency performance heterojunction bipolar transistors (HBT) are $f_{max}$ and $f_\tau$, where $f_{max}$ is the frequency at which unilateral gain becomes unity and $f_\tau$ is the current-gain cutoff frequency. An approximate expression of $f_{max}$ is (1)

$$f_{max} = \sqrt{\frac{f_\tau}{8\pi R_B C_{BC}}},$$

where $R_B$ is the parasitic base resistance and $C_{BC}$ is the base collector capacitance. Equation (1) shows the relation of $f_{max}$ to $f_\tau$, $R_B$ and $C_{BC}$. To enhance $f_{max}$, $f_\tau$ should be increased and $R_B$ and $C_{BC}$ should be minimized.

$R_B$ is the parasitic base resistance, which is essentially a combination of the ohmic contact resistance and the base access resistance of the transistor. FIG. 3 is a simplified diagram that shows those two resistive components. The base contact resistance is dependent upon the base layer material, the base layer doping and the ohmic metal technology used to fabricate the base contact, which are nearly independent of the base layer thickness. On the other hand, the base access resistance is inversely proportional to base layer thickness. For a given material and doping, thick base layers provide low base access resistance, while thin base layers possess high access resistance. Consequently, to reduce $R_B$, the base layer thickness should be increased.

$C_{BC}$ is the base to collector capacitance. That capacitance is a function of the thickness of the collector layer, the dielectric constant, $\epsilon_\tau$ of the collector material, and the base-collector junction area. A lower $C_{BC}$ is obtained with thicker collector layers, smaller junction areas and lower dielectric constants. The base-collector area is given by the base mesa width, w, and length, l, as illustrated in FIG. 2.

Returning to FIG. 1, the current gain cutoff frequency, $f_\tau$, is the frequency at which the transistor small signal current gain is unity. That cutoff frequency can be estimated using the following equation:

$$f\tau = \frac{1}{2\pi\tau_{EC}},$$

where $\tau_{EC}$ is the emitter to collector electron transit time. In other words, $\tau_{EC}$ is the time that the electrons require to travel from the emitter 9 to the subcollector 3, and that transit time depends principally on the thickness of the base 7 and collector 5 layers. For thick layers, the transit time is greater; and for thin layers the transit time is shorter. This flow is depicted in FIG. 1 as the vertical wide dash-line arrow extending from the emitter 9 to the subcollector 3. Thus, to increase $f_\tau$, the thickness of the base and collector layers should be reduced.

From the foregoing dependencies, the compromise that is made in the design of an HBT to obtain an optimum $f_{max}$ and $f_\tau$ becomes evident. For high $f_\tau$, the HBT structure must possess thin base and collector layers, but that degrades $f_{max}$ by increasing $R_B$ and $C_{BC}$.

A prior technique for fabricating HBT's with reduced base to collector capacitance is known as the "transferred substrate" technique. In that technique the emitter and base of the HBT are fabricated on the front side of the InP wafer and the wafer is then mounted front side down on a carrier or surrogate substrate. The original semiconductor substrate is then removed and the collector structure and the remaining elements of the circuit are fabricated upon the surrogate (transferred) substrate. That technique is described in U.S. Pat. No. 5,318,916 and in an article "48 GHz Digital ICs Using Transferred Substrate HBT's," M. Rodwell et al, GaAs IC Symposium Technical Digest, November 1998.

The Rodwell et al. Technique possesses an inherent disadvantage. In addition to the complexity of the fabrication process, there is a discrepancy between the coefficient of thermal expansion of the semiconductor layer in which the HBT devices are fabricated and the thermal expansion coefficient of the surrogate substrate. That difference creates alignment problems once the circuits are on the surrogate substrate and limits the size of the circuit that may be fabricated.

In a typical HBT, much of the base-collector capacitance originates in the areas under the base ohmic contact. These areas, illustrated between the dotted vertical lines 6 and 8 and the respective adjacent side edges of collector 5 at the right and left hand sides, shown in FIG. 1, do not participate in significant vertical current conduction in collector 5 and only contribute to an increase in base-collector capacitance, $C_{BC}$. Hence, those areas may be regarded as excess. By removing those excess regions of the collector, a cantilevered base with undercut collector structure is created, and the $C_{BC}$ is reduced substantially by the removal of a relatively high dielectric material, approximately 13 in InP. The present invention is of that approach.

Such an approach to improving the HBT structure through undercutting the collector to reduce base-collector capacitance is also the subject of an earlier publication by Miyamoto, Rios, Dentai and Chandrasekhar, in an article "Reduction of Base-Collector Capacitance by Undercutting the Collector and Subcollector in GaInAs/InP DHBT's," The Electron Devices Letters, Vol. 17, No. 3, March 1996, pages 97–99.

In the HBT device that Miyamoto et al thought practical, the collector layer was undercut, apparently about the periphery thereof, removing considerable high dielectric material of the collector material. Lacking robustness in the resultant structure, the removed material was replaced with and covered overall with an insulating material of a lower dielectric constant, polyimide, the dielectric constant of which is about 4. Applied as a fluid (and later cured) the polyimide is poured over the semiconductor die and seeps into and fills all the crevices, and provides a covering sheet for the semiconductor. To complete the Rodwell et al HBT device, extra processing is used to attach leads to the electrical contacts. Namely, Oxygen plasma etching is performed to open windows (passages) in the polyimide covering to permit access to the collector metal and the emitter metal. Then pad metal was evaporated on the hardened polyimide to fill those windows and provide a through-hole conductor for the electrical connection to the contact metal on the semiconductor layers.

As a disadvantage, the dielectric constant of polyimide is significantly greater than air or other conventional gases that might be hermetically sealed in the package of the HBT (or HBT's) or in which environment the HBT may be operated. Hence, the HBT design proposed by Miyamoto et al would not possess as low a base-collector capacitance, $C_{BC}$ than otherwise appears possible.

As an advantage, the present invention does not require planarizing the wafer (and HBT transistors in the wafer) with a deep coating of polyimide material. Hence, the present avoids any necessity for etching openings through a polyimide fill in order to attach electrical leads to the elements of the HBT. As another advantage, the present invention obtains inherently a lower $C_{BC}$ than the HBT of Miyamoto et al and, hence, a higher operating frequency.

As a further advantage, apart from changes in masking definition, the invention requires only existing technology for manufacture of the HBT, employing the same materials and processing techniques as in the prior art HBT's.

Accordingly, a principal object of the invention is to provide a HBT that possesses improved high frequency performance.

Another object of the invention is to provide an HBT construction that possesses a lower base to collector capacitance than previously thought possible.

SUMMARY

A heterojunction bipolar transistor contains an emitter, base and collector; with each of the emitter, base and collector comprising a non-rectangular parallelogram in geometry. More specifically, the transistor is formed of a crystalline material which contains crystal planes [0 0 1], [0 0 $\bar{1}$], [0 1 0], [0 $\bar{1}$ 0 ], [0 1 1] and [0 $\bar{1}$ $\bar{1}$] and in which the foregoing non-rectangular parallelogram geometry of the emitter, base and collector contains one pair of parallel sides oriented parallel to said (0 0 1) crystal plane (or [0 0 $\bar{1}$] crystal plane) and the second pair of parallel sides oriented parallel to said [0 1 1] plane. As a consequence in one direction the side edges of the collector undercut the base and in the other direction the side edges of the collector slope down from the edge of the base and outwardly of that base edge. Insulated electrical leads extend along the sloped edge of the collector and are firmly supported. While the undercutting of the base reduces base to collector capacitance considerably.

The foregoing and additional objects and advantages of the invention together with the structure characteristic thereof, which was only briefly summarized in the foregoing passages, will become more apparent to those skilled in the art upon reading the detailed description of a preferred embodiment of the invention, which follows in this specification, taken together with the illustrations thereof presented in the accompanying drawings.

DESCRIPTION OF THE PREFERRED EMBODIMENTS

Figure 1:
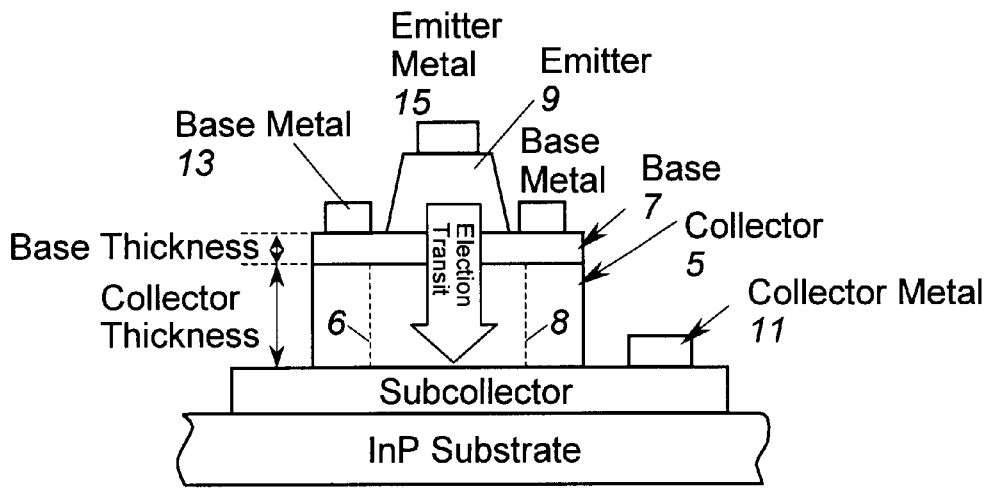
FIG. 1 illustrates a HBT of the prior art in side view, presented as part of the background to the invention.
Figure 2:
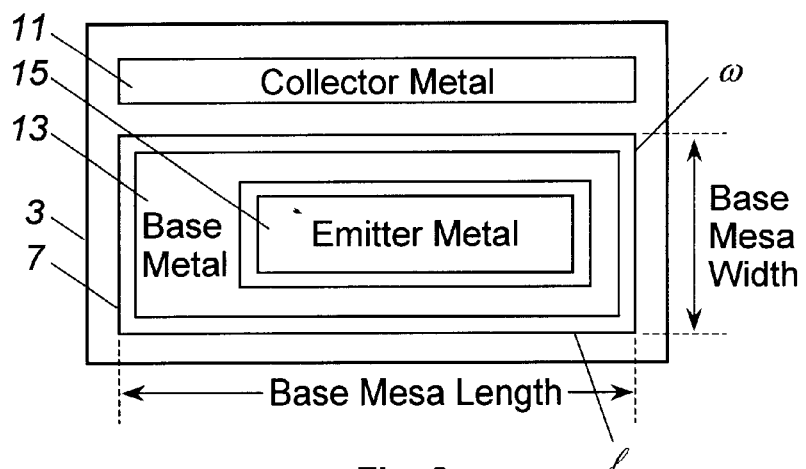
FIG. 2 illustrates the prior art HBT of FIG. 1 in top view.
Figure 3:
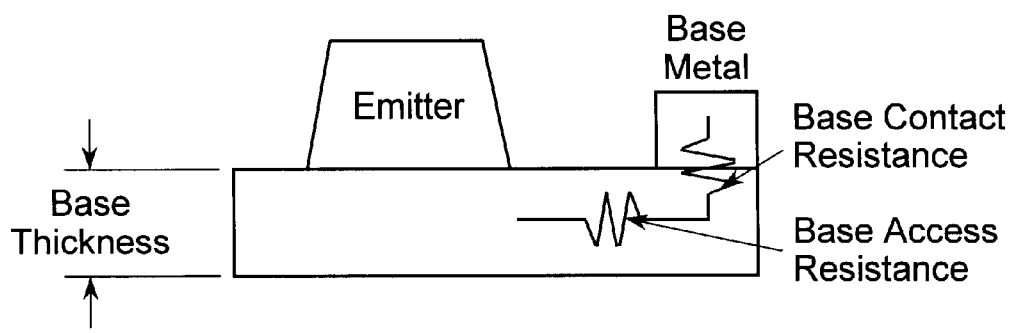
FIG. 3 is a pictorial illustration of a portion of a conventional HBT presented as part of the background to the invention.
Figure 4:
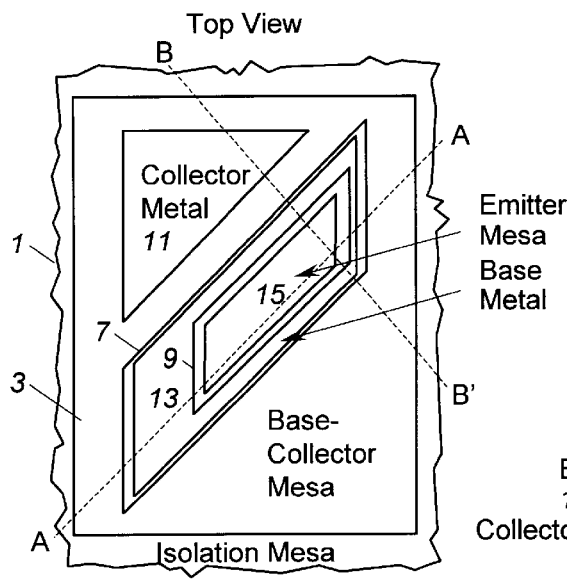
FIG. 4 illustrates an embodiment of the HBT invention in top view.

FIG. 4, to which reference is made, illustrates the improved HBT transistor in top plan view. For convenience, the elements of the HBT in this figure (and the succeeding figures) of the new construction are identified by the same number as the corresponding element of the prior transistor. The subcollector 3 (and underlying substrate, not illustrated) is rectangular in shape, and is slightly larger in area than the corresponding region of the prior art HBT of FIG. 1. It should be appreciated that the new HBT embodiment is constructed of materials referred to in the preceding background to this description and employs the conventional prior art processing techniques there described. Each of the emitter mesa (emitter 9 and emitter metal 15) and the base metal 13 and base region 7 (eg. base mesa region) is of the shape of a non-rectangular parallelogram, the angle formed between the adjoining sides of the parallelogram being different from ninety degrees.

The longer sides of each mesa region are parallel to the (0 0 1) plane of the InP crystal structure. The shorter sides are parallel to the (0 1 1) sides of the InP crystal structure. As those skilled in the art recognize the parallelogram geometry departs from the rectangular geometry for those elements provided in the prior art. The collector metal 11 is of the shape of a triangle. As is apparent the shape and size of the various layers of the HBT are a mirror of the masks used in the resist and etch processing procedures to define the parallelogram shape. Hence, the masks used in the resist and etch procedure during fabrication must be of like non-rectangular parallelogram shape.

Figure 5:
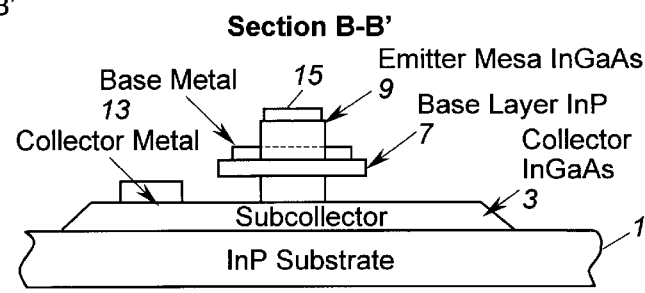
FIG. 5 illustrates a section view of the HBT of FIG. 4 taken along the lines B–B' in FIG. 4.

FIG. 5 illustrates the HBT of FIG. 4 in a side view taken along the lines B–B' in FIG. 4, perpendicular to lines A–A' in the figure. The collector 5 is undercut of the base 7. The left and right hand side edges of collector 5 are vertical in profile (or may slope outward slightly). In using the terms inwardly (or outwardly) it is understood that inwardly refers to a direction toward the central axis of the HBT; outwardly refers to the direction away from that axis. The left profile of collector 5 extends from position on the underside of the base 7, laterally inwardly spaced from the left outer edge of the base (the undercut) vertically down to subcollector 3. The right profile of collector 5 extends from a another position on the underside of base 7, also laterally inwardly spaced from the right side edge of the base and straight down to subcollector 3. The undercuts eliminate the high dielectric material of the collector which contribute to base-collector capacitance, earlier referred to as "waste," thus permitting the HBT to operate at higher frequencies.

Figure 6:
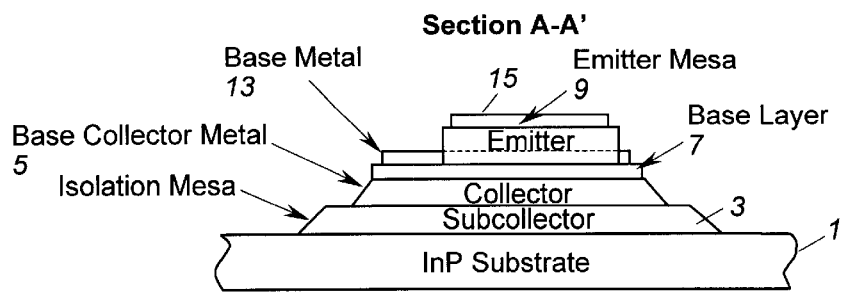
FIG. 6 illustrates another section view of the HBT, perpendicular to the section of FIG. 5, taken along the lines A–A' in FIG. 4.

FIG. 6 illustrates a partial side section view of the HBT taken along lines A–A' in FIG. 4, perpendicular to lines B–B' in that figure, and, hence, perpendicular to the view of FIG. 5. The exterior edge of collector 5 extends in a downward slope from the corresponding edge of base 7 to a location on subcollector 3 that is laterally outwardly displaced from the edge of the base. The foregoing structure is subsumed in the illustration of FIG. 7 to which reference is next made for additional description.

Figure 7:
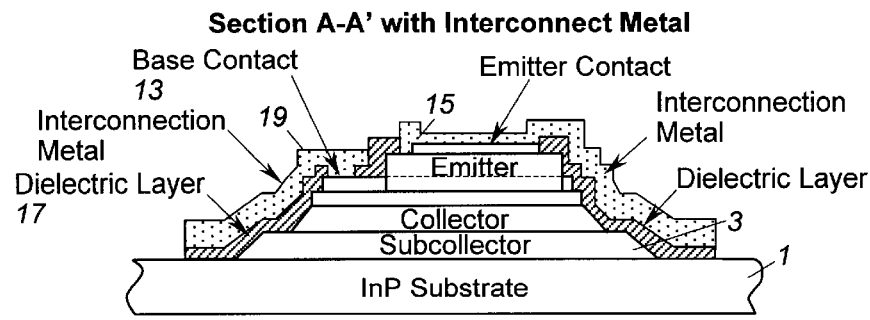
FIG. 7 illustrates a section view (corresponding to the view of FIG. 6) of a completed but unpackaged HBT with the interconnection metal and insulating material in place.

FIG. 7 is the same view as in FIG. 6 of a completed, but unpackaged, HBT. A layer of dielectric material 17, suitably silicon nitride, covers the upper sides of the semiconductor die with openings in that material over the base metal and emitter metal. The collector metal 11, shown in FIG. 4 does not appear in this cross section view which is taken along the lines A–A' of a completed device. Using a photo-resist or other masking process, interconnection metal 19 is deposited into the openings in the silicon nitride dielectric and along the sloping side edges of the insulating portion of the transistor. The foregoing interconnection 19 serves as the electric leads to the respective base and emitter contacts, 13 and 15.

As one observes, in this section view the side edges of the collector 5 (and subcollector 3) are outwardly downwardly sloped. The left side edge of collector 5 extends from the left side edge of the base 7 outwardly and downwardly to a location on the subcollector 3 laterally spaced from the left side edge of the base. There is no undercut of base 7. The right side edge of the collector is likewise sloped and has the same relationship to the right side edge of base 5 as on the left side edge. The sloping edge forms a firm support for the silicon nitride insulating layer 17 and the interconnection metal 19 that overlies that slope, ensuring that the HBT is mechanically sound.

The foregoing structure is accomplished through the normal fabrication processing earlier described in the background to this invention. Although the same selective acids are employed and operate on the same crystalline material, what results in one direction is an undercut of the base layer, and in the perpendicular direction, no undercut results, but instead a sloping side edge to the collector is produced. The foregoing geometry is produced by the selective etching of the crystal.

Figure 8:
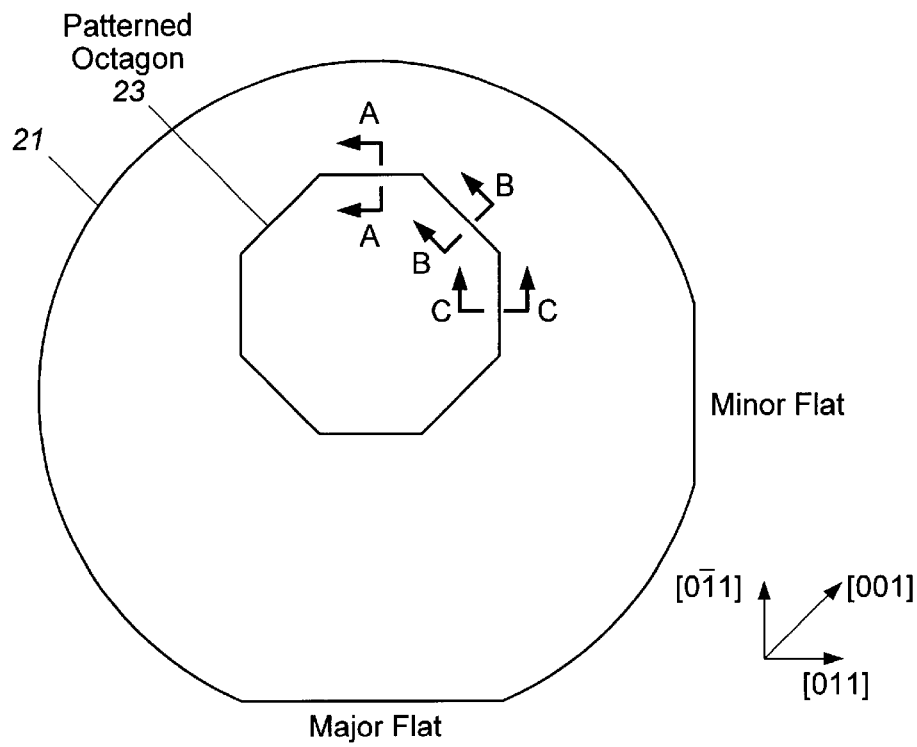
FIG. 8 is a pictorial illustration of a crystalline semiconductor wafer that assists in an understanding of the theory underlying the invention.
Figure 9:
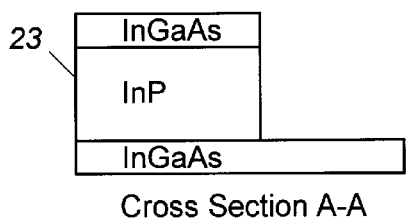
FIGS. 9, 10 and 11 are partial side section views showing profiles taken along different planes of the crystal structure of the wafer of FIG. 8 to demonstrate the effect of selective etching.
Figure 10:
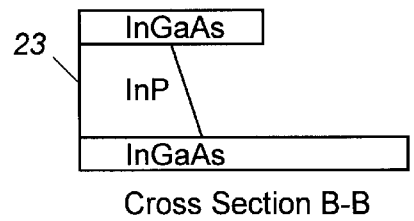
Figure 11:
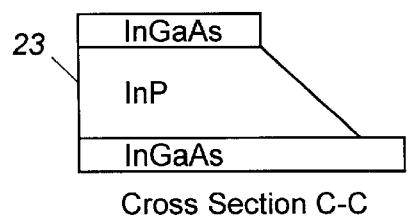

It has long been known that the rate of etching the InP crystal material is dependent upon the orientation of the various planes of the crystal being etched, and, in that sense, etching is uneven. For the most part that knowledge has been employed to design the masks for HBT fabrication so that the edges of the mask fall parallel to the planes in which etching produces no undercut (or minimal undercut) of the InP material underlying the base layer. The only exception to the foregoing of which applicant is aware, is the procedure described in the Miyamoto article, earlier cited, which, as in the present invention, calls for deliberately undercutting the base layer An InAlAs/InGaAs/InP structure has the property that it is etched selectively with hydrochloric ("HCl") based acid solutions depending on the material (InGaAs or InP) and the crystal plane. To illustrate that selective etching, reference is made to FIG. 8 which illustrates a top view of an InP wafer 21 with the crystal orientation indicated by the arrows and an octagon 23 patterned in the wafer. After etching the wafer, the edges of the octagon facets of the pertinent layers of the material forming the octagon appear as illustrated in partial cross section views in FIGS. 9, 10 and 11. Those figures illustrate three of the layers of material, the upper portion of the subcollector, formed of InGaAs; the collector, formed of InP, and the base, formed of InGaAs. The emitter layer, formed of InGaAs, is omitted from the section views and not illustrated. The cross-section of FIGS. 9, 10 and 11 show the profile for planes (0 $\bar{1}$ 1), (0 0 1) and (0 1 1), respectively, of the wafer. The same profiles are obtained for the opposite planes, not illustrated.

To obtain the foregoing profiles in the HBT of FIGS. 4–7, the InAlAs/InGaAs/InP wafer structure is first etched with a phosphoric acid based solution that etches the top InAlAs and InGaAs layer and stops at the InP. Then the structure is etched with an HCl acid based solution that etches the InP layer, but does not etch the top InAlAs or the InGaAs layers. As is appreciated, the foregoing selective etching is not possible with an ordinary bipolar transistor structure (homojunction) because the material is the same for the three different layers.

The foregoing wafer structure is that used for fabrication of an HBT. The InGaAs layer corresponds to the base (7, FIG. 5) of the HBT, the InP layer corresponds to the collector (5, FIG. 5) and the lower InGaAs layer corresponds to the subcollector (3, FIG. 5) of the HBT. The upper InAlAs layer, which corresponds to the emitter is not illustrated.

FIG. 9 is recognized as the profile of the HBT's of conventional structure. Sides of the HBT that require an undercut should be parallel to plane [0 0 1] (or to the opposite plane [0 0 $\bar{1}$]. That is the orientation that is used in the structure presented in the Miyamoto et al. publication and in the present invention; and sides that require a slope for the metal step coverage should be parallel to plane [0 1 1] (or the opposite plane [0 $\bar{1}$ $\bar{1}$]). The masks for the various layers must be of the parallelogram shape with sides oriented relative to the planes of the crystalline structure as earlier described; and those masks must be appropriately oriented aligned with the respective planes of the crystal during the masking steps of the fabrication process, prior to the described etching.

As is apparent the present invention achieves an HBT that has the physical soundness of those that do not employ an undercut of the base, and a lower base-collector capacitance that can be obtained with the HBT structure proposed in the Miyamoto et al. publication. A superior performing HBT is achieved.

Although the invention has been described in connection with InAlAs/InGaAs/InP HBT transistors, as those skilled in the art recognize, the invention is applicable to all heterojunction type transistors formed in a crystalline material in which different layers require different etchants to produce the required etching.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. A heterojunction bipolar transistor, said transistor comprising an emitter, base and collector; said collector underlying, being contiguous with and supporting said base, said base underlying, being contiguous with and supporting said emitter and each of said emitter, base and collector further comprising a non-rectangular parallelogram in geometry, and said collector further comprising crystalline material, said crystalline material having planes [0 0 1], [0 0 $\bar{1}$], [0 1 0], [0 $\bar{1}$ 0], [0 1 1] and [0 $\bar{1}$ $\bar{1}$]; and wherein said non-rectangular parallelogram of each of said emitter, base and collector contains a first pair of parallel sides oriented parallel to one of said [0 0 1] and [0 0 $\bar{1}$] planes and a second pair of parallel sides oriented parallel to one of said [0 $\bar{1}$ 1] and [0 1 $\bar{1}$] planes.

2. The heterojunction bipolar transistor as defined in claim 1, further including: a subcollector, said subcollector underlying, being contiguous with and supporting said collector; and a pair of insulated electrical leads; said pair of insulated electrical leads including a first insulated electrical lead extending alongside and crossing aver a side edge of both said subcollector and said collector of said transistor to said base.

3. A heterojunction bipolar transistor, said transistor comprising:

an emitter comprising InAlAs material;
a base comprising InGaAs material;
a collector comprising InP material;
a subcollector comprising InGaAs material; and
a substrate comprising InP material;

said emitter, base, collector, subcollector and substrate comprising a grown crystalline structure with said subcollector overlying said substrate, said collector overlying a portion of said subcollector, said base overlying said collector and said emitter overlying a portion of said base;

said grown crystalline structure including a plurality of crystal planes, said crystal planes being identified as planes [0 0 1], [0 0 $\bar{1}$], [0 1 0], [0 $\bar{1}$0], [0 1 1] and [0 $\bar{1}$ $\bar{1}$];

a first metal contact on an upper side of said base;

a second metal contact on an upper side of said emitter;

each of emitter, base and collector respectively defining a four-sided figure in geometry;

each said four sided figure of said emitter and base including:
  first and second pairs of parallel sides, said first pair of parallel sides being oriented in parallel to one of said [0 0 1] and [0 0 $\bar{1}$] crystal planes and said second pair of sides being oriented in parallel to one of said [0 1 1] and [0 $\bar{1}$ $\bar{1}$] crystal planes;

said four sided figure of said collector including a first pair of parallel sides, said first pair of parallel sides being oriented in parallel to one of said [0 0 1] and [0 0 $\bar{1}$] crystal planes and a second pair of sides, each of said sides in said second pair having a slope and each of said sides having an edge oriented in parallel with one of said [0 1 1] and [0 $\bar{1}$ $\bar{1}$] crystal planes;

said first pair of parallel sides of the four-sided figure of said collector being undercut of the first pair of parallel sides of said four-sided figure of said base; and each of said sides of said second pair of sides of said four-sided figure of said collector sloping down from and outwardly away from one of said sides of said second pair of parallel sides of said four-sided figure of said base and to a position on said subcollector;

a first layer of insulating material extending along said sloped edge of one of said pair of sides of said collector; and a layer of metal extending along said first layer of insulating material and into contact with said first metal contact of said base; and a second layer of insulating material extending along said sloped edge of a second one of said pair of sides of said collector; and a second layer of metal extending along said second layer of insulating material and into contact with said second metal contact on said emitter.

4. A heterojunction bipolar transistor, said transistor comprising an emitter, base and collector; and each of said emitter, base and collector further comprising a non-rectangular parallelogram in geometry, each said non-rectangular parallelogram comprising first and second pairs of sides, each of said sides of said first pair being in parallel with one another, and each of said sides of said second pair being in parallel with one another; said collector being undercut of said base along said first pair of sides of said non-rectangular parallelogram defined by said base; and said collector being outwardly downwardly sloped along said second sides of said non-rectangular parallelogram defined by said base.

* * * * *